United States Patent [19]

Saito

[11] Patent Number: 4,606,010
[45] Date of Patent: Aug. 12, 1986

[54] DYNAMIC MEMORY DEVICE

[75] Inventor: Shozo Saito, Yokohama, Japan

[73] Assignee: Tokyo Shibaura Denki Kabushiki Kaisha, Japan

[21] Appl. No.: 423,145

[22] Filed: Sep. 24, 1982

[30] Foreign Application Priority Data

Oct. 23, 1981 [JP] Japan ............................ 56-169887

[51] Int. Cl.³ .............................................. G11C 11/24
[52] U.S. Cl. .................................. 365/149; 365/189; 365/210
[58] Field of Search ............... 365/149, 189, 190, 210, 365/230, 182

[56] References Cited

U.S. PATENT DOCUMENTS 4,045,783  8/1977  Harland .............................. 365/149
4,363,111 12/1982  Heightley et al. .................. 365/210

FOREIGN PATENT DOCUMENTS 5577083 12/1978  Japan .

OTHER PUBLICATIONS

J. Y. Chan et al., "A 100 ns 5 V Only 64K×1 MOS Dynamic RAM," IEEE Journal of Solid-State Circuits, vol. SC-15, No. 5, (Oct. 1980), pp. 839–845.
S. Sheffield Eaton et al., "A 100ns 64K Dynamic RAM Using Redundancy Techniques", ISSCC Digest of Technical Papers, pp. 84–85, (Feb. 1981).

Primary Examiner—James W. Moffitt
Attorney, Agent, or Firm—Finnegan, Henderson, Farabow, Garrett & Dunner

[57] ABSTRACT

A dynamic memory device has a plurality of column unit arrangements. Each of the column unit arrangements includes first and third bit lines connected through first and third switching transistors to a first input terminal of a sense amplifier and second and fourth bit lines connected through second and fourth switching transistors to a second input terminal of the sense amplifier. The other ends of the third and fourth bit lines are connected through fifth and sixth switching transistors to a corresponding data line. A switching control signal cuts off at least one of the first switching transistor group including the first and second switching transistors and the second transistor group including the third and fourth switching transistors during only a given period of time containing time points before and after a time point at which the fifth and sixth switching transistors are turned on when data is written into a memory cell selected from memory cells connected to the bit lines.

7 Claims, 14 Drawing Figures

DYNAMIC MEMORY DEVICE

BACKGROUND OF THE INVENTION

The present invention relates to a dynamic memory device in which a plurality of pairs of bit lines are connected to a single sense amplifier.

The integration density of dynamic random access memory devices has been improved remarkably in recent years. The improvement of the integration density has depended largely on the improvement of lithography accuracy and reduction of a design rule resulting from the improvement of the working accuracy. Advances in circuit technology further contributed to the improvement of the integration density.

An example of the improved circuit technology is described by S. S. Eaton et al in their paper entitled "A 100 ns 64 Kilo Dynamic RAM using Redundancy techniques" in ISSCC Digest of Technical Papers, p 84, Feb. 1981. The paper describes the dynamic memory device of the shared sense amplifier system. That technique can improve an integration density by remarkably reducing the space of the peripheral circuitry associated with the dynamic circuit section. In the prior dynamic memory device, a pair of bit lines is connected to a single sense amplifier. For increasing the number of memory cells using the prior art technique, the number of memory cells connected to the pair of bit lines must be increased. When the number of the memory cells connected to a single bit line is increased, the stray capacitance of the bit line increases reducing the input signal to the sense amplifier in read/write mode. This is undesirable. When an amount of charge to be stored in a single memory cell is reduced to increase bit density, the input signal to the sense amplifier also decreases. In the prior art 64K bit memory device in which a pair of bit lines is connected to a single sense amplifier, 64 memory cells are connected to a single bit line. For this reason, it is difficult to connect 128 memory cells to a single bit line to form a memory device of 256K bits.

In the shared sense amplifier system, two pairs of bit lines are connected to a single amplifier, a switching transistor is connected between the sense amplifier and each bit line. For sensing or writing data from and to the cells, the switching transistor is driven to electrically connect one of the two pairs of the bit lines to the sense amplifier. This shared sense amplifier system will be called a multibit line system.

A useful feature of the multibit line system resides in that the input signal to the sense amplifier is not reduced even if the number of memory cells to be connected to a single sense amplifier are increased as compared with the prior art two bit line system. Accordingly, by connecting 64 memory cells to a single bit line, a dynamic RAM of 256K bits or more can be formed.

A disadvantage of the conventional multibit line system is that the write time of data into memory cells is longer than that of the two bit line type of the prior art dynamic memory device. In the prior two bit line system, a pair of bit lines connected to the sense amplifier is directly connected to a pair of the data bus lines. For this reason, date can be written into the memory cells at a relatively high speed. On the other hand, in the conventional multibit line system, ends of the first pair of the bit lines are connected to a sense amplifier through switching transistors. The other ends of the first pair of bit lines are directly connected to a pair of data lines through switching transistors. Therefore, the conventional multibit line system allows data to be written into the memory cells connected to this first pair of bit lines at a high speed. However, ends of the second pair of the bit lines are connectecd to the sense amplifier through switching transistors and the other ends thereof are extended in the opposite direction to that of the first pair of bit lines. When data is written into the memory cells connected to the second pair of bit lines, data must be written through the switching transistors inserted into the first and second pairs of bit lines. For this reason, it takes a relatively long time to write data.

SUMMARY OF THE INVENTION

The object of the present invention is to provide a dynamic memory device of the multibit line system including a first pair bit lines connected at the first ends to a sense amplifier through first switching transistors, a second pair bit lines connected at the first ends to the sense amplifier through second switching transistors and at the second ends thereof to a pair of data lines through third switching transistors, and means for cutting off at least one of the first switching transistor group and second switching transistor group during only a given period of time including time points before and after a time point at which the third switching transistors are turned on, thereby to write data in a selected memory cell in a short time.

According to the present invention, there is provided a dynamic memory device with a plurality of column unit arrangements, each unit arrangement including a sense amplifier with a first input terminal and a second input terminal; at least two pairs of bit lines having a first bit line connected through a first switching transistor to the first input terminal, a second bit line connected through a second switching transistor to the second input terminal, a third bit line connected through a third switching transistor to the first input terminal, and a fourth bit line connected through a fourth switching transistor to the second input terminal; a fifth switching transistor for connecting the third bit line to one of a pair of data lines and a sixth switching transistor for connecting the fourth bit line to the other data line of the pair of the data lines, the fifth and sixth switching transistors being turned on and off by a column address signal; a first group of memory cells of which a plurality of memory cells are connected to the first to fourth bit lines, respectively, each memory cell being selected by a combination of the column address signal and a row address signal; and first switching control means for cutting off at least one of first and second groups of switching transistors during only a given period of time including time points before and after a time point at which the column address signal is applied to the gates of the fifth and sixth switching transistors when data is written into a memory cell selected from the first group of memory cells through the pair of the data lines, whereby to rapidly charge the bit line containing the selected memory cell, the first group of switching transistors including the first and second switching transistors and the second group of switching transistors including the third and fourth switching transistors.

DETAILED DESCRIPTION OF THE PREFERRED EMBODIMENTS

Figure 1:
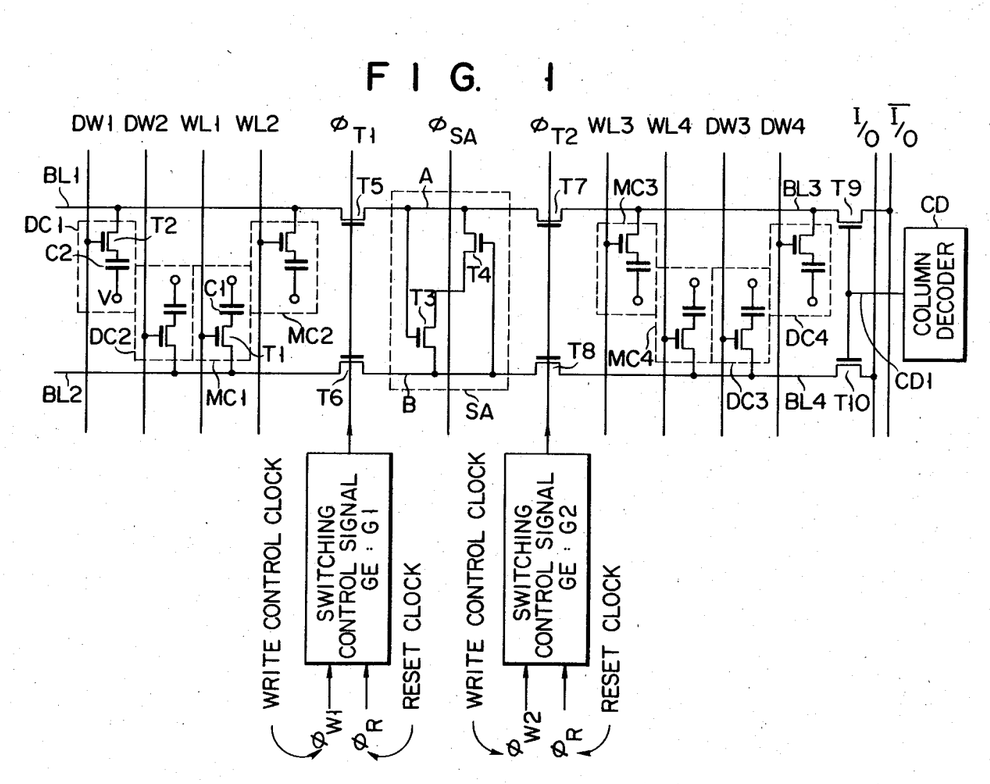
FIG. 1 is a circuit diagram of a column unit arrangement of an embodiment according to the present invention.

A dynamic memory device according to the present invention contains a plurality of column unit arrangements as shown in FIG. 1. In FIG. 1, a sense amplifier SA includes a transistor T3 with its source-drain path connected between a supply line for a drive signal $\phi_{SA}$ of the sense amplifier and a second input terminal B of the sense amplifier and with its control gate connected to a first input terminal A of the sense amplifier. A transistor T4 has its source-drain path connected between the drive signal supply line and the second input terminal B and the control gate connected to the second input terminal B. With this connection, the sense amplifier SA amplifies signals coming through the first and second input terminals A and B. The amplifying operation of the sense amplifier is performed when the drive signal $\phi_{SA}$ is at ground level.

A first bit line BL1 is connected through a first switching transistor T5 to the first input terminal A, while a second bit line BL2 is connected through a second switching transistor T6 to the second input terminal B. A third bit line BL3 is connected at one end to the first input terminal A through a third switching transistor T7, and at the other end to a data bus line $\overline{I/}$ through a fifth switching transistor T9. A fourth bit line BL4 is connected at one end to the input terminal B through a fourth switching transistor T8, and at the other end to a data bus line I/O through a sixth switching transistor T10.

A memory cell MC2 and a dummy cell DC1 are connected to the bit line BL1; a memory cell MC1 and a dummy cell DC2 are connected to the bit line BL2; a memory cell MC3 and a dummy cell DC4 are connected to the bit line BL3; and a memory cell MC4 and a dummy cell DC3 are connected to the bit line BL4. A single dummy cell is connected to each bit line, while a plurality of memory cells, e.g. 64, are connected to the same bit line. Each of the memory cells and dummy cells is made up of a transistor whose drain is connected to a corresponding bit line and a capacitor one end of which is connected to the source of the transistor. The transistor of a memory cell is represented by T1 and the capacitor of the same memory cell is represented by C1. The transistor of a dummy cell is denoted by T2 and the capacitor of the same dummy cell is denoted by C2. The capacitance of the capacitor C2 is half of that of the capacitor C1.

The gate electrodes of the transistors T2 in the dummy cells DC1 to DC4 are connected to the dummy word lines DW1 to DW4, respectively. Corresponding to the word line of the selected memory cell, the signals applied to the dummy word lines are "1" and the corresponding transistors T2 are ON. The gate electrodes of the transistors T1 forming the memory cells MC1 to MC4 are connected to the word lines WL1 to WL4, respectively. When the row address signals applied to the word lines are "1" in logical level, the corresponding transistors T1 are ON.

A column address signal CD1 is applied from a column decoder CD to the gate electrodes of the fifth and sixth transistors T9 and T10. When the signal CD1 is logical "b 1", these transistors are ON amd when CD1 is logical "0", these transistors are OFF. A switching control signal $\phi_{T1}$ is an output signal from the switching control signal generator G1, and is not only coupled for reception with a write control clock $\phi_{W1}$ and a reset clock $\phi_R$, but also is applied to the gate electrodes of the switching transistors T5 and T6. A switching control signal $\phi_{T2}$ as an output signal from the switching control signal generator G2, coupled for reception with a write control clock $\phi_{W2}$ and a reset clock $\phi_R$, is applied to the gate electrodes of the switching transistors T7 and T8. Since the switching control signal generators G1 and G2 have the same structure, only the generator G1 will be described by an example referring to FIG. 3.

Figure 3:
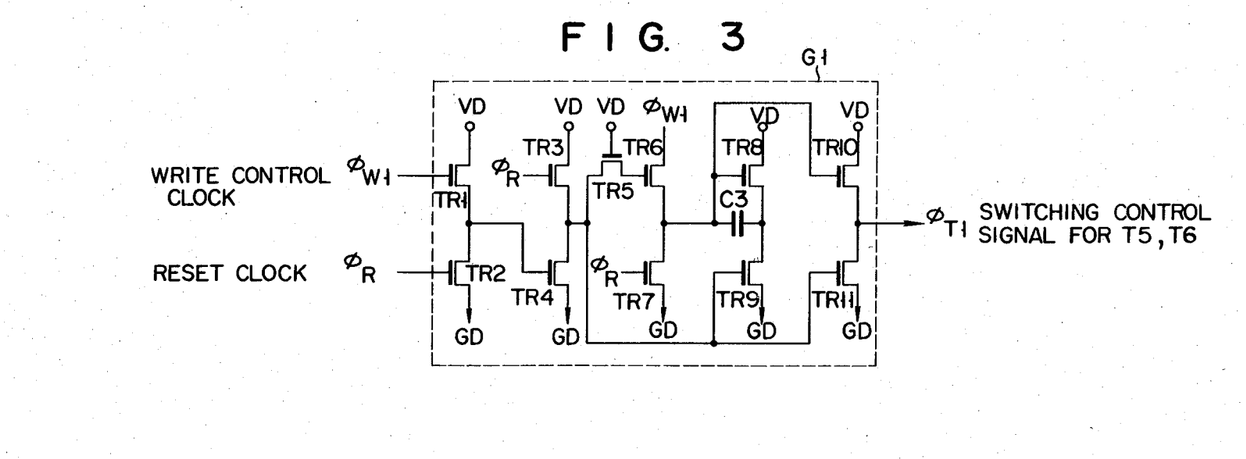
FIG. 3 shows a circuit diagram of example of a switching control signal generator shown in FIG. 1.

MOS transistors TR1 to TR11 and a capacitor C3 are interconnected as shown. With this arrangement, a write control clock $\phi_{W1}$ is applied to the gate electrode of the transistor TR1 and the drain of the transistor TR6. A reset clock $\phi_R$ is applied to the gate electrodes of the transistors TR2 and TR7. The capacitor C3 is coupled between the gate electrode and the source of the transistor TR8. The transistors TR8 and TR10 are interconnected to each other at the gate electrodes.

A DC voltage VD is applied to the drains of the transistors TR1, TR3, TR8 and TR10 and the gate electrode of the transistor TR5. The drains of the transistors TR2, TR4, TR7, TR9 and TR11 are held at the reference voltage GD. The switching control signal $\phi_{T1}$ is derived from a connecting node between the source-drain paths of the transistors TR10 and TR11. In the switching control signal generator G2, the write control clock $\phi_{W1}$ and the switching control signal $\phi_{T1}$ are replaced by the write control clock $\phi_{W2}$ and the switching control signal $\phi_{T2}$, respectively.

Figures 4A, 4B, 4C:
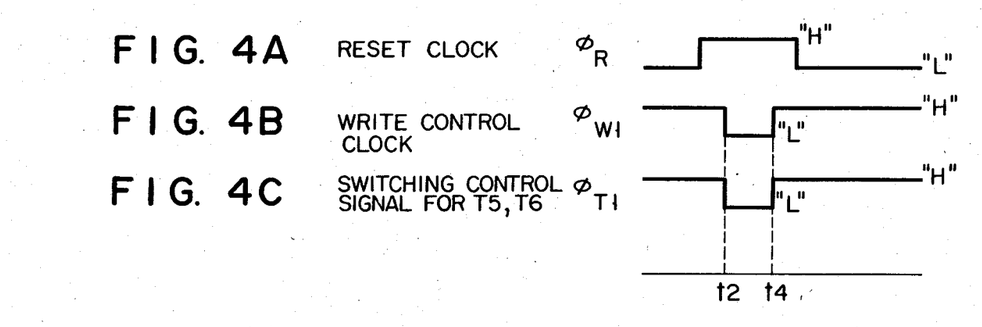
FIGS. 4A to 4C show timing charts useful in explaining the operation of the switching control signal generator shown in FIG. 3.

The switching control signal generator shown in FIG. 3 is known and frequently used in the memory device, for example. As shown in FIGS. 4A to 4C, if the write control clock $\phi_{W1}$ is applied to the gate of the transistor TR1 and to the drain of the transistor TR6, and the reset clock $\phi_R$ to the gates of the transistors TR2, TR3 and TR7, a switching control signal $\phi_1$ to be explained later can be obtained.

The read operation of data from a selected memory cell will be described referring to FIG. 1. In FIG. 1, for reading out data from a selected memory cell, the bit lines BL1 and BL2 are paired and the bit lines BL3 and BL4 are paired, and data is read out through the data bus lines I/O and $\overline{I/}$. It is assumed that the capacitors C2 of the dummy cells DC1 to DC4 are not charged at an initial stage. Explanation will be given using an example where data is read out from the memory cell MC1 associated with the bit line BL2. The bit lines BL1 and BL2 are precharged by a precharge means (not shown).

A row address signal is applied simultaneously to the word line WL1 and the dummy word line DW1. Then, the switching control signal $\phi_{T1}$ is set at "1"; the switching transistors T5 and T6 are turned on; the switching control signal $\phi_{T2}$ is set at "0", and the switching transistors T7 and T8 are turned off; and the drive signal $\phi_{SA}$ is set at ground level to make the sense amplifier SA ready for operation. A row address signal is applied simultaneously to the word line WL1 and the dummy word line DW1. Then, the switching transistors T7 and T8 are turned on; the column address signal CD1 is set at "1"; the switching transistors T9 and T10 are ON. In this way, data is read out from the memory cell MC1 through the bus lines I/O and $\overline{I}/$.

At this time, the capacitor C2 of the dummy cell DC1 is charged by the precharge voltage on the bit line BL1 and the capacitor C1 of the memory cell MC1 is charged by the precharge voltage on the bit line BL2. The charge into the capacitors C1 and C2 is performed simultaneously. When the data "1" is stored in the memory cell MC1, the voltage on the bit line BL2 (voltage at the input terminal B) is larger than the voltage on bit line BL1 (voltage at the input terminal A). When the data "0" is loaded into the memory cell MC1, the voltage at the input terminal B is smaller than that at the input terminal A. The voltages on the bit lines BL1 and BL2 are amplified by the sense amplifier SA, and are applied through the switching transistors T7 to T10 to the data bus lines I/O and $\overline{I}/$, with the result that data is read out from the memory cell MC1.

For reading out data from the memory cell MC2, the dummy cell DC2 is used. For reading out data from the memory cell MC3, the bit lines BL3 and BL4 are used as a pair. That is, after the precharge of the bit lines BL3 and BL4 and the selection of the memory cell MC3 and the dummy cell DC3, the voltages on the bit lines BL3 and BL4 are amplified by the sense amplifier SA and are led out from the data bus lines $\overline{I}/$ and I/O through the switching transistors T9 and T10. For reading out data from the memory cell MC4, the dummy cell DC4 is used.

The circuit shown in FIG. 1 is conventional except for the switching control signal generators G1 and G2. Further, the process for reading out data from the memory cells is also known, so no further explanation will be given.

Figure 2A:
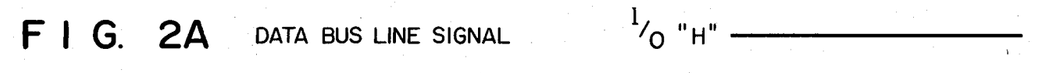
FIGS. 2A to 2G are timing charts useful in explaining the operation of the column unit arrangement shown in FIG. 1 when data is written into memory cells.
Figures 2B, 2C:
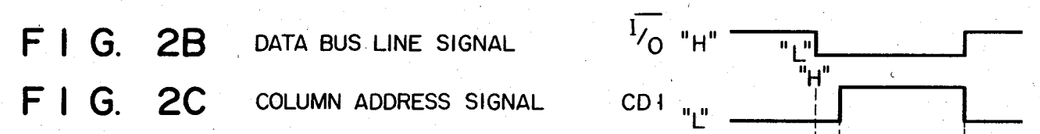
Figure 2D:
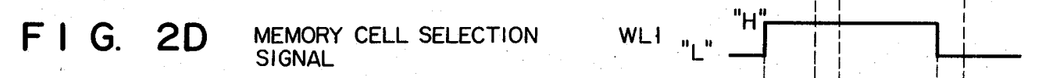
Figures 2E, 2F:
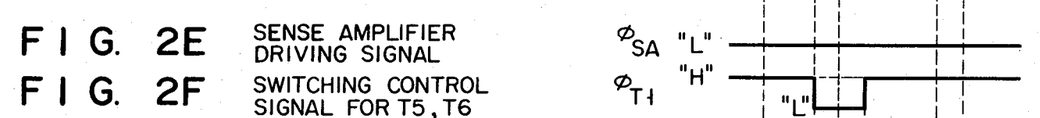
Figure 2G:
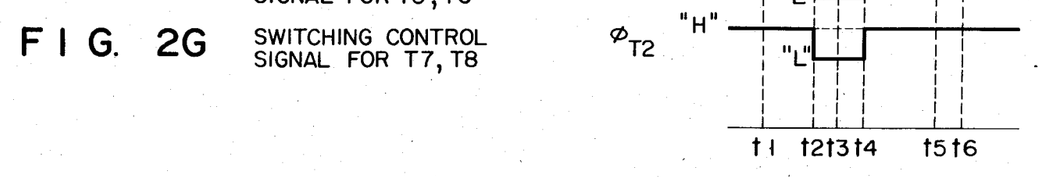

A write operation of data into a memory cell will be described referring to timing charts shown in FIGS. 2A to 2G and 4A to 4C. For writing data into the memory cell MC1, for example, the row address signal applied to the word line WL1 is made "H" at time t1 for selecting the memory cell MC1. The data bus line I/O is held at "H" and the data bus line $\overline{I}/$ is set at "L" at time t2 (FIG. 2B). At time t2, the switching control signals $\phi_{T1}$ and $\phi_{T2}$ are switched from "H" to "L" (FIGS. 2F and 2G). At time t3, the column selection signal CD1 is set at "H" to turn on the switching transistors T9 and T10 (FIG. 2C). At time t4, the switching control signals $\phi_{T1}$ and $\phi_{T2}$ are set at "H" and the switching transistors T5 to T8 are turned on (FIGS. 2F and 2G). At time t5, the signal on the word line WL1 is set at "L" (FIG. 2D), and at time t6 the column address signal CD1 is set at "L" (FIG. 2C), and the data bus line $\overline{I}/$ is set at "H" (FIG. 2B).

In the present embodiment, at time t2 before the column address signal CD1 becomes "H" in level, namely, before the switching transistors T9 and T10 are turned on, the switching control signals $\phi_{T1}$ and $\phi_{T2}$ are set at "L" to turn off the switching transistors T5 to T8. Then, at the proper time t4 after the switching transistors T9 and T10 are turned on, the switching transistors T5 to T8 are turned on. If so done, only the bit line BL4 is first charged by the voltage ("H" level) applied to the data bus line I/O (FIG. 2A), then the sense amplifier SA operates and then the bit line BL2 is charged. Accordingly, data is written into the memory cell MC1 at a relatively high speed.

At this time, the voltage level at the input terminal A of the sense amplifier SA is at "L". Accordingly, the sense amplifier SA operates in response to the voltage level at the input terminal B, i.e. the charge voltage at the bit line BL4. Since the gate capacity of the transistor T4 in an ON state is small, the bit line BL2 is charged at a high speed and data is written into the memory cell MC1 at a high speed.

The prior art dynamic memory device is not provided with means for rendering the switching control signals $\phi_{T1}$ and $\phi_{T2}$ low when data is written into the memory cell MC1, for example, during a time period t2 to t4. Therefore, during this time, these signals are held at "H" level. In other words, the data is written into the memory cell when the transistors T5 to T8 are in an ON state. According to the prior art data write method, the stray capacitances of the bit lines BL4, BL2 and in the sense amplifier SA must be charged. Therefore, in order to raise the voltage on the bit line BL2 up to a sufficient write voltage, it takes a relatively long time.

On the other hand, in the present invention, at least the switching transistors T7 and T8 are cut off at time t2 before time t3 when the switching transistors T9 and T10 are turned on and the bit line BL4 is charged up to a sufficient voltage. And at time t4, at least the switching transistors T7 and T8 are turned on. Therefore, the sense amplifier can be operated quickly without decreasing the input signal to the sense amplifier SA. Additionally, the write time for writing data into the memory cell MC1 can be reduced with a quick charge operation to the bit line BL2. The same thing is true for writing data into the memory cell MC2. For writing data into the memory cell MC4 or MC3, the switching transistors T5 to T8 are OFF at time t2 before time t3 when the transistors T9 and T10 are turned on, and after the bit line BL4 or BL3 is sufficiently charged, the switching transistors T7 and T8 are turned on.

In the embodiment shown in FIG. 1, as shown in FIGS. 2F and 2G at time t2, the switching transistors T5 to T8 are turned off. If only the switching transistors T7 and T8 are turned off, similar effects may be attained. The time period from time t3 to t4 shown in FIGS. 2F and 2G is desirably as short as possible, considering the stray capacitance of the bit line BL4 or BL3 and the sense amplifier SA. After time t3, switching transistors T7 and T8 may be switched on earlier than the switching transistors T5 and T7.

The write control clock falling at time t2 and rising at time t4, as shown in FIG. 4B can easily be derived from a clock generating system of the memory device. Accordingly, the switching control signal $\phi_{T1}$ in synchronism with the write control clock $\phi_{W1}$ easily obtained from the conventional circuit shown in FIG. 3. The same thing is true for the write control signal $\phi_{W2}$ as an input signal to the switching control signal generator G2.

Figure 5:
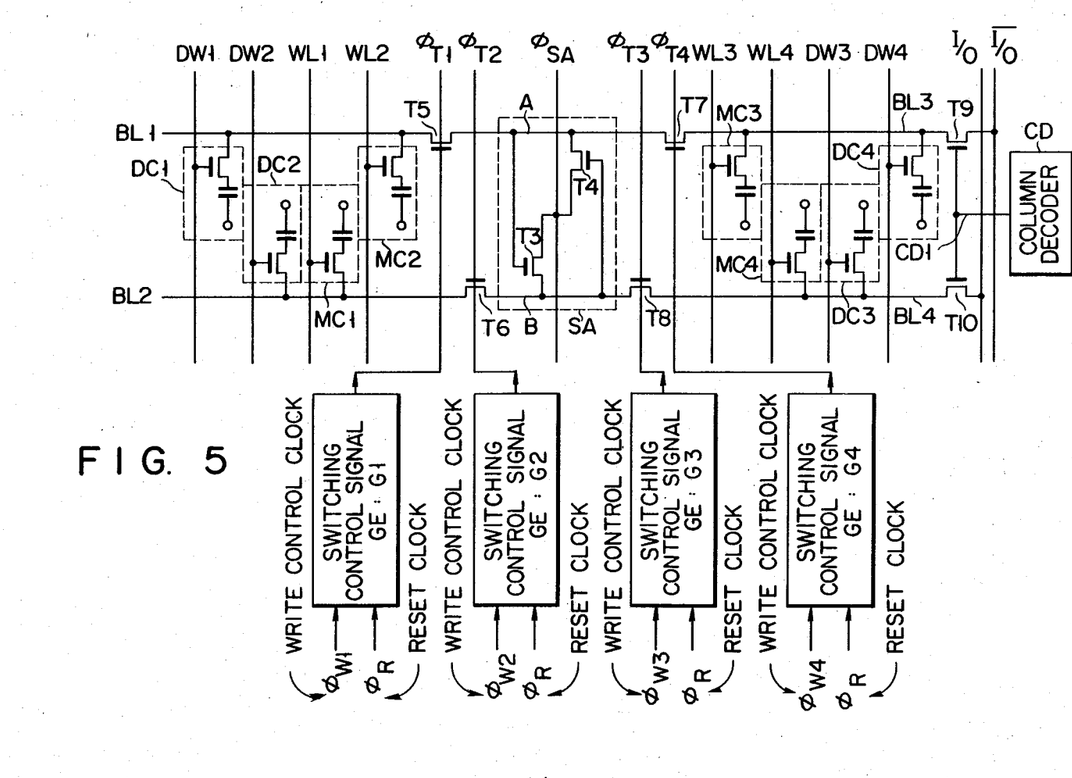
FIG. 5 is a block diagram of another embodiment of a column unit arrangement of the present invention.

The embodiment of FIG. 5 is different from that of FIG. 1 in the following points. The switching transistor T5 is controlled by the switching control signal $\phi_{T1}$ from the switching control signal generator G1 which receives the write control clock $\phi_{W1}$ and reset clock $\phi_R$. The switching transistor T6 is controlled by the switching control signal $\phi_{T2}$ from the switching control signal generator G2 receiving the write control clock $\phi_{W2}$ and the reset clock $\phi_R$. The switching transistor T7 is controlled by the switching control signal $\phi_{T3}$ from the switching control signal generator G3 receiving the write control clock $\phi_{W3}$ and the reset clock $\phi_R$. The switching transistor T8 is controlled by the switching control signal $\phi_{T4}$ from the switching control signal generator G4 supplied with the write control clock $\phi_{W4}$ and the reset clock $\phi_R$. The write control clock $\phi_{W1}$ may be used for the write control clocks $\phi_{W2}$ to $\phi_{W4}$.

In FIG. 5, in a read mode, the bit lines BL1 and BL4 are used as one pair, while the bit lines BL2 and BL3 are used as the other pair. In other words, in this mode, the switching transistors T5 to T8 are individually controlled. The circuit shown in FIG. 5 is conventional except the switching control signal generators G1 to G4. Further, the process for reading out data from the memory cells is also known. No explanation of this will be given.

In a write mode, the switching transistors T5 and T6 are simultaneously turned on and off and the transistors T7 and T8 are simultaneously turned on and off. Only during a given period (t2 to t4) including time points before and after the time that the transistors T9 and T10 are turned on, at least one of the pairs of the switching transistors T5 and T6, and T7 and T8 is turned off (see FIGS. 2A to 2G).

Figure 6:
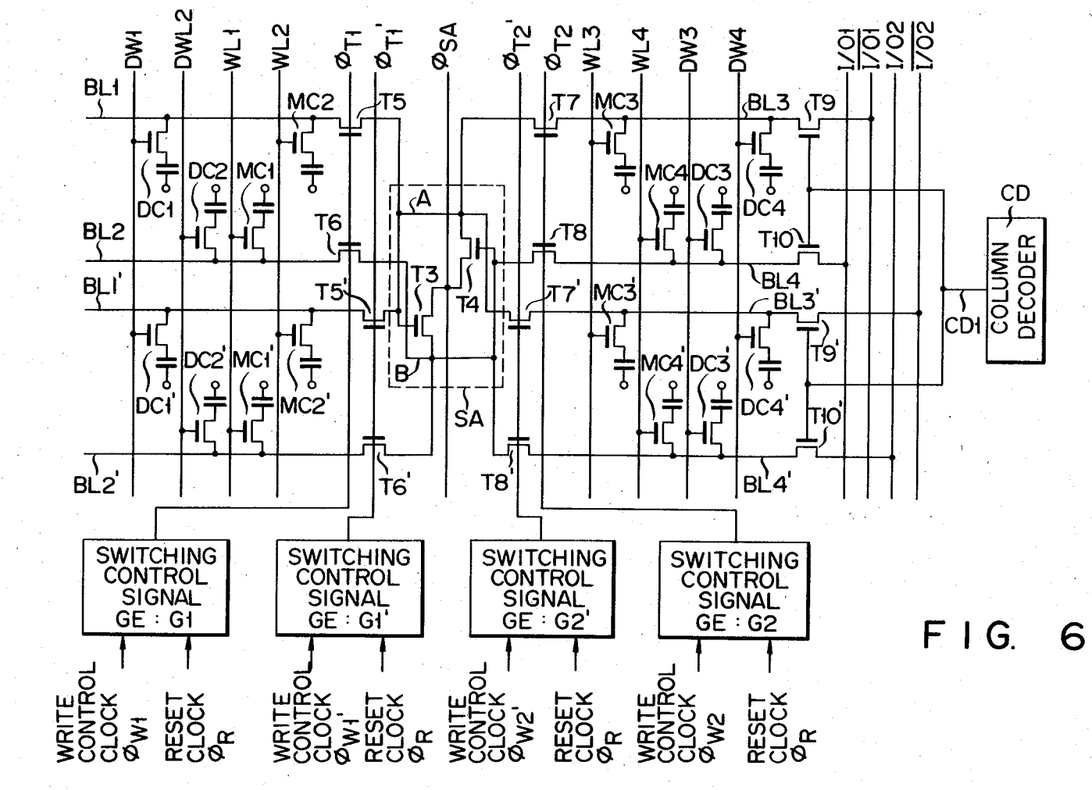
FIG. 6 shows a block diagram of yet another embodiment of a column unit arrangement according to the present invention.

Another embodiment of the present invention will be described referring to FIG. 6. The present embodiment corresponds to the embodiment shown in FIG. 1 having additionally the following elements. A bit line BL1' is connected to the input terminal A of the sense amplifier SA through a switching transistor T5'. A bit line BL2' is connected to the input terminal B through a switching transistor T6'. A bit line BL3' is connected to the input terminal A through the switching transistor T7'. The bit line BL4' is connected to the input terminal B through the switching transistor T8'. The other end of the bit line BL3' is connected to the line Ī2/ of the second pair of the data bus lines through the switching transistor T9'. The bit line BL4' is connected to the data line I/02 through the switching transistor T10'. Memory cells and dummy cells are connected to the bit lines BL1' to BL4'. These memory cells and the dummy cells are arranged symmetrically with the memory cells and the dummy cells connected to the bit lines BL1 to BL4. These additional elements are designated by primed numerals, respectively. The gates of the corresponding memory cells with primed and unprimed reference numerals are interconnected with one another.

Further additional elements are a switching control signal generator G1' for applying a switching control signal $\phi_{T1'}$ to the switching transistors T5' and T6', and another switching control signal generator G2' for applying a switching control signal $\phi_{T2'}$ to the switching transistors T7' and T8'. A column address signal CD1 is applied to the gates of the switching transistors T9, T10, T9' and T10'. A process for reading out data from a selected memory cell connected to the bit lines BL1', BL2', BL3' and BL4' is exactly the same as that for writing data into a selected memory cell as described referring to FIG. 1. A feature of the present embodiment resides in that the reading and writing of data can be performed without reducing the signal inputted to a single sense amplifier SA, even if the 64 memory cells are connected to each of the bit lines. The embodiment shown in FIG. 6 can form a memory device of 256K bits or more, while the FIG. 1 embodiment can form a memory device of 256K bits in which 64 memory cells are connected to a single bit line. Further, four or more pairs of bit lines can be connected to a single sense amplifier.

What is claimed is:

1. A dynamic memory device with a plurality of column unit arrangements, each unit arrangement including:
   a sense amplifier with a first input terminal and a second input terminal;
   at least two pairs of bit lines having a first bit line connected through a first switching transistor to said first input terminal, a second bit line connected through a second switching transistor to said second input terminal, a third bit line connected through a third switching transistor to said first input terminal, and a fourth bit line connected through a fourth switching transistor to said second input terminal;
   a fifth switching transistor for connecting said third bit line to one of a pair of data lines and a sixth switching transistor for connecting said fourth bit line to the other data line of said pair of said data lines, said fifth and sixth switching transistors being turned on and off by a column address signal;
   a first group of memory cells of which a plurality of memory cells are connected to said first to fourth bit lines, respectively, each memory cell being selected by a combination of said column address signal and a row address signal; and
   first switching control means for cutting off at least one of a first and a second group of switching transistors during only a given period of time including time points before and after a time point at which said column address signal is applied to the gates of said fifth and sixth switching transistors when data is written into a memory cell selected from said first group of memory cells through said pair of said data lines, whereby to rapidly charge the bit line containing said selected memory cell, said first group of switching transistors including said first and second switching transistors and said second group of switching transistors including said third and fourth switching transistors.

2. A dynamic memory device with a plurality of column arrangements, each unit arrangement including;
   a sense amplifier with a first input terminal and a second input terminal;
   at least two pairs of bit lines having a first bit line connected through a first switching transistor to said first input terminal, a second bit line connected through a second switching transistor to said second input terminal, a third bit line connected to a third switching transistor to said first input terminal, and a fourth bit line connected through a fourth switching transistor to said second input terminal;
   a fifth switching transistor for connecting said third bit line to one of a pair of data lines and a sixth switching transistor for connecting said fourth bit line to the other data line of said pair of data lines, said fifth and sixth switching transistors being turned on and off by a column address signal;
   a first group of memory cells of which a plurality of memory cells are connected to said first and fourth bit lines, respectively, each memory cell being selected by a combination of said column address signal and a row address signal;

first switching control means for cutting off at least one of a first and second group of switching transistors during only a given period of time including time points before and after a time point at which column address signal is applied to the gates of said fifth and sixth switching transistors when data is written into a memory cell selected from said first group of memory cells through said pair of data lines to rapidly charge the bit lines containing said selected memory cell, said first group of switching transistors including said first and second switching transistors, said second group of switching transistors including said third and fourth switching transistors;

a further group of bit lines having a fifth bit line connected through a seventh switching transistor to said first input terminal, a sixth bit line connected through an eighth switching transistor to said second input terminal, a seventh bit line connected through a ninth switching transistor to said first input terminal, and an eighth bit line connected through a tenth switching transistor to said second input terminal;

an eleventh switching transistor for connecting said seventh bit line to one of a second pair of data lines and a twelfth switching transistor for connecting said eighth bit line to the other of said second pair of data lines, said eleventh and twelfth switching transistors being turned on and off by said column address signal;

a second group of memory cells of which a plurality of memory cells are connected to each of said fifth to eighth bit lines, each memory cell being selected by a combination of said column address signal and a row address signal; and second switching control means for cutting off at least one of third and fourth groups of switching transistors during only a given period of time including time points before and after the time point at which said column address signal is applied to the gates of said eleventh and twelfth switching transistors when data is written into a memory cell selected from said second group of memory cells through said second pair of data lines, whereby to rapidly charge a bit line containing the memory cell selected from said second group of memory cells, said third group of switching transistors including said seventh and eighth switching transistors and said fourth group of switching transistors including said ninth and tenth switching transistors.

3. A memory device according to claim 1, wherein said first switching control means includes means for cutting off only said first group of switching transistors including said first and second switching transistors during only said given period of time.

4. A memory device according to claim 1, wherein said first switching control means includes control means for cutting off simultaneously said first and second groups of switching transistors including said first to fourth switching transistors and for making said given cut off period of said second group of switching transistors longer than that of said first group of switching transistors.

5. A dynamic memory device according to claim 1, wherein said first switching control means controls said switching transistors of said first and second groups of switching transistors by a switching control signal, respectively.

6. A dynamic memory device according to claim 1, wherein each of said first to fourth bit lines is coupled with 64 memory cells, whereby to form a 256K bits dynamic memory device.

7. A dynamic memory device according to claim 2, wherein each of said first to eighth bit lines is coupled with 64 memory cells.

* * * * *